United States Patent [19]

Tursky

[11] Patent Number: 4,760,438
[45] Date of Patent: Jul. 26, 1988

[54] THYRISTOR EMITTER SHORT CONFIGURATION

[75] Inventor: Werner Tursky, Nuremberg, Fed. Rep. of Germany

[73] Assignee: Semikron Gesellschaft für Gleichrichterbau und Elektronik m.b.H., Nuremberg, Fed. Rep. of Germany

[21] Appl. No.: 59,222

[22] Filed: May 28, 1987

Related U.S. Application Data

[63] Continuation of Ser. No. 258,530, Apr. 18, 1981, abandoned.

[30] Foreign Application Priority Data

May 8, 1980 [DE] Fed. Rep. of Germany ....... 3017584

[51] Int. Cl.[4] .............................................. H01L 29/74
[52] U.S. Cl. .......................................... 357/38; 357/86
[58] Field of Search ..................................... 357/38, 86

[56] References Cited

U.S. PATENT DOCUMENTS 4,150,390 4/1979 Jaecklin ................................. 357/38

FOREIGN PATENT DOCUMENTS 2438894 8/1974 Fed. Rep. of Germany ........ 357/38
2123322 2/1978 Fed. Rep. of Germany ........ 357/38
7633327 8/1978 Fed. Rep. of Germany ........ 357/38

OTHER PUBLICATIONS

Hartmann, *IEEE Trans. on Elec. Dev.*, vol. ED-23, No. 8, Aug. 1976, pp. 912–917, "Improvement . . . Injection".
Munoz–Yague et al, IEEE Trans. on Elec. Dev., vol. ED 23, No. 8, Aug. 1976, pp. 917–924, "Optimum Design . . . Geometry".

*Primary Examiner*—Andrew J. James
*Assistant Examiner*—Jerome Jackson
*Attorney, Agent, or Firm*—Spencer & Frank

[57] ABSTRACT

A thyristor comprising a semiconductor body having at least four sequential layers of alternatingly opposite conductivity types. One of the layers is an emitter zone and the contiguous layer of opposite conductivity type is a base zone. A control electrode is electrically connected to the base zone and surrounded by the emitter zone. A first penetration region, including at least first and second groups of apertures in the emitter zone arranged in corresponding concentric circles of different diameters about the control electrode, permits electrical contact between the base and emitter zones. The number of apertures in each of the first and second groups is the same, and the region of the emitter zone in which the first penetration region is located is of smaller expanse than the remainder of the emitter zone. A second penetration region surrounding the first penetration region includes a plurality of apertures in the emitter zone which are arranged in a polygonal pattern to permit electrical contact between the base and emitter zones. This polygonal pattern of apertures includes transitional polygons having a portion thereof located inside of or abutting the concentric circle of the first penetration region which is most remote from the control electrode. Each of the transitional polygons has apertures only at those vertices outside the most remote concentric circle and an additional aperture within the area defined by the transitional polygon.

10 Claims, 2 Drawing Sheets

THYRISTOR EMITTER SHORT CONFIGURATION

This application is a continuation, of application Ser. No. 06/258,530, filed Apr. 28, 1981 now abandoned.

BACKGROUND OF THE INVENTION

The invention relates to a thyristor whose semiconductor body includes a sequence of at least four layer-like zones of alternatingly opposite conductivity type and an emitter zone which at least in part encloses the control electrode and is provided with channeling for the penetration of the adjacent base zone to the emitter electrode.

In thyristors having so-called shorted emitters, the base zone, which is provided with the control electrode, penetrates to their common surfacae through channeling in the adjacent emitter zone and the parts of the base zone passing through the emitter zone are electrically contacted together via the emitter electrode and short-circuit the emitter zone. If a blocking voltage of great steepness occurs across the thyristor, the capacitive effect of the blocking pn-junction causes part of the shifting current to flow through the penetrations directly into the emitter electrode. This reduces the injection effect of the emitter zone into the adjacent base zone so that, with a corresponding penetration density, firing of the thyristor is prevented.

In known thyristor embodiments, the penetrations are arranged in a square, hexagonal, radial or involute-shaped pattern. Thus German Patent No. 2,123,322 discloses the provision of penetrations on lines which radially emanate from the control electrode. In order to realize a certain minimum penetration density over the emitter area, additional penetrations are provided on the angle bisector between adjacent radii where the latter are further apart from one another. Such an arrangement, however, does not exhibit the uniform penetration density required for optimization of the dv/dt behavior.

Particularly when the circular control electrode, which is advantageous for the operation of a thyristor, is disposed in the center of the one major surface, some of the prior art penetration patterns exhibit the drawbacks of uneven spacing, differences in density as well as insufficient firing propagation.

Additionally, German Patent No. 2,438,894 discloses a thyristor with shorted emitte where the shorts have a diameter equal to or less than 20 $\mu$ and wherein the ratio of the distance between two adjacent shorts to their diameter is greater than or equal to three. Since either value of the ratio, and thus the ratio itself, is selectable, the disclosed dimensioning rule does not provide a teaching as to how optimization of the dv/dt behavior as well as the firing propagation can be realized with a pattern for arranging the penetrations particularly in the region near the control electrode.

SUMMARY OF THE INVENTION

It was the object of the invention to provide a pattern for arranging the emitter shorts in the semiconductor body of a thyristor so as to provide, at least in the region near the control electrode, a locally uniform firing sensitivity and in the entire region of the emitter zone a uniform density of the penetrations.

To solve this problem, it is assumed that the penetrations closest to a circular control electrode are disposed on a concentric line around the control electrode and that the number and position of the penetration are determined in a known manner by the desired stability of the dv/dt behavior, which is given by the doping conditions, as well as by the geometry of the doped zones and of the emitter electrode. In this connection, reference is made to K. Hartman, "Improvement of Thyristor Turn-On by Cancellation of the Gate-Cathode Characteristic Before Injection", IEEE Transactions [on] Electron Devices, Vol. ED-23, [1976] No. 8, pages 912–917, as well as to A. Munoz-Yague and Leturcq, "Optimum Design of Thyristor Gate Emitter Geometry", IEEE Transaction[s] [on] Electron Devices, Vol. ED-23, 1976, No. 8, pages 917–924.

The solution of this problem for a thyristor of the above-mentioned type is that, in a first penetration region adjacent the control electrode, whose region has a smaller areal expanse than the remaining region of the emitter zone, the penetrations or apertures are arranged in a pattern of lines that are at an unchaning distance from the control electrode and in the remaining or second penetration region the apertures are arranged in a polygonal pattern and that, in order to provide the desired penetration density, additional penetrations are provided in the transition region between the patterns.

The control electrode may have a circular disc shape or may be arcuate and, in the region adjacent the control electrode, the penetrations are then advantageously arranged in a circular or circular segment pattern concentric with the control electrode.

Advantageously, in view of the number of penetrations on the innermost line being given, the mutual distance between the lines is selected in such a manner that adjacent penetrations on adjacent lines form the corners of approximately equilateral triangles.

Moreover, the pattern according to the invention is designed in such a manner that each one of the lines concentric with the control electrode has the same number of penetrations and approximately the same distance from the adjacent lines.

With a circular pattern, the ratio of the radii of the outermost circle to the innermost circle should be no more than 4.

Preferably, the penetrations are given a circular disc shape and are arranged in a circular pattern. In order to assure the desired penetration density in the region of the transition from the pattern of lines with unchanging distance from the control electrode to the polygonal pattern, those polygons, called transitional polygons, of the latter pattern which abut a line or are intersected by a line, without a penetration on the line falling into their area, each have an additional penetration in the center of their respective areas.

The penetrations in the remaining region of the emitter zone are preferably arranged in a rectangular or triangular pattern.

BRIEF DESCRIPTION OF THE DRAWINGS

The subject matter of the invention will be illustrated and explained with the aid of the greatly enlarged, exemplary representation of an arrangement of penetrations in FIGS. 1 and 2.

DESCRIPTION OF THE PREFERRED EMBODIMENT

Figure 1:
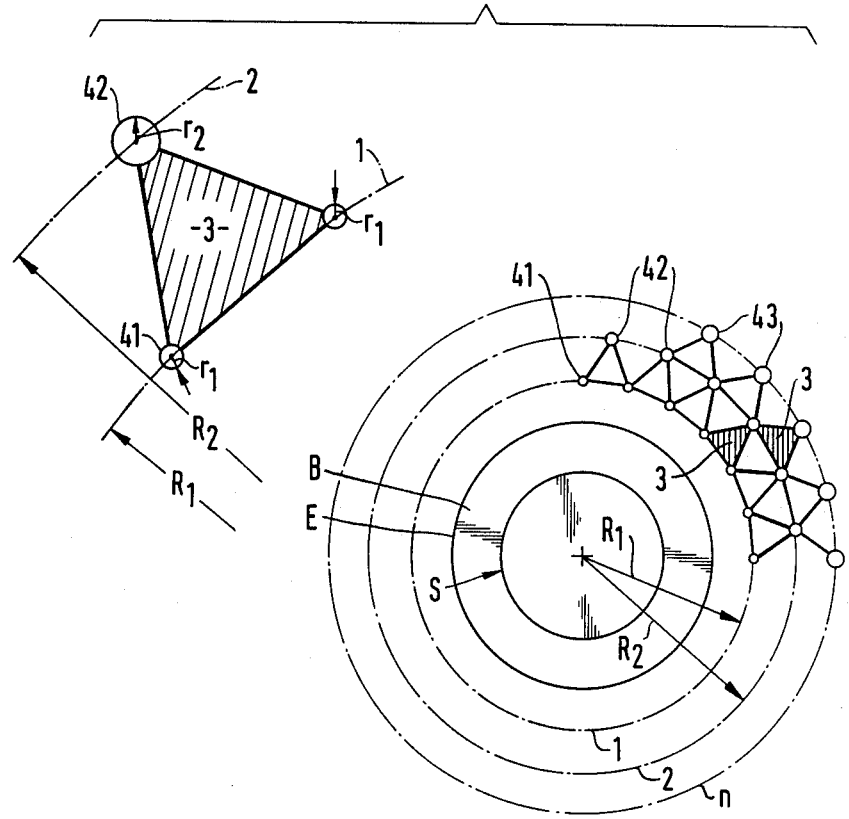
FIG. 1 shows part of a circular pattern with circular disc shaped penetrations in the region of the emitter zone adjacent the control electrode and FIG. 2 shows part of both patterns with mutual overlapping. Like parts have been given the same reference numerals in both figures.

In the embodiment of a semiconductor body according to FIG. 1, the circular disc shaped control electrode S in the center of a semiconductor disc is concentrically enclosed by the inner edge E of the emitter zone. The position of the first circle 1 having the radius $R_1$ and the penetrations 41 is determined in a known manner by operational and technological considerations. Moreover, the circle 1 is concentrically enclosed by a circle 2 of penetrations 42. The mutual distance between the two circles is determined by the fact that adjacent penetrations 41 and 42 on the two circles each form the corners of approximately equilateral triangles. This rule results in a regular arrangement of a like number of penetrations on all circles. This regular pattern of penetrations also brings about a uniform arrangement of firing propagation channels in the vicinity of the control electrode.

The uniform density of the penetrations for the purpose of optimizing the dv/dt behavior is assured in that the total area of all penetrations on each further circle following circle 1 is enlarged to correspond to the increase of the circular areas and thus also of the areas of the associated emitter zone sections. This total area is limited due to the fact that the circular penetration pattern, which is advantageous for optimization of firing propagation, furnishes too small a number of penetrations, although it extends considerably into the emitter zone, so that the dv/dt behavior in the vicinity of the control electrode is impaired. Favorable results have been realized with a circular pattern in a region where the outer circle n has no more than four times the radius of the circle 1. For example, in a semiconductor body whose emitter surface has a diameter of 23 mm, the region with the concentric arrangement of the penetrations may take up an area of 14% of the emitter area.

If a blocking voltage of great steepness appears across the load current electrodes (not shown), the barrier layer capacitance of the thyristor causes a shifting current to flow to the emitter electrode applied on the emitter zone. However, only part of this current flows into the emitter zone (E).

The other part flows through the penetrations 41, 42, 43 etc. of the base zone B into the emitter electrode and into the conductor fastened thereto (likewise not shown). This causes the injection effect of the emitter zone to be reduced correspondingly so that the thyristor will not fire. Firing can occur only on the basis of a voltage of greater steepness.

Figure 2:
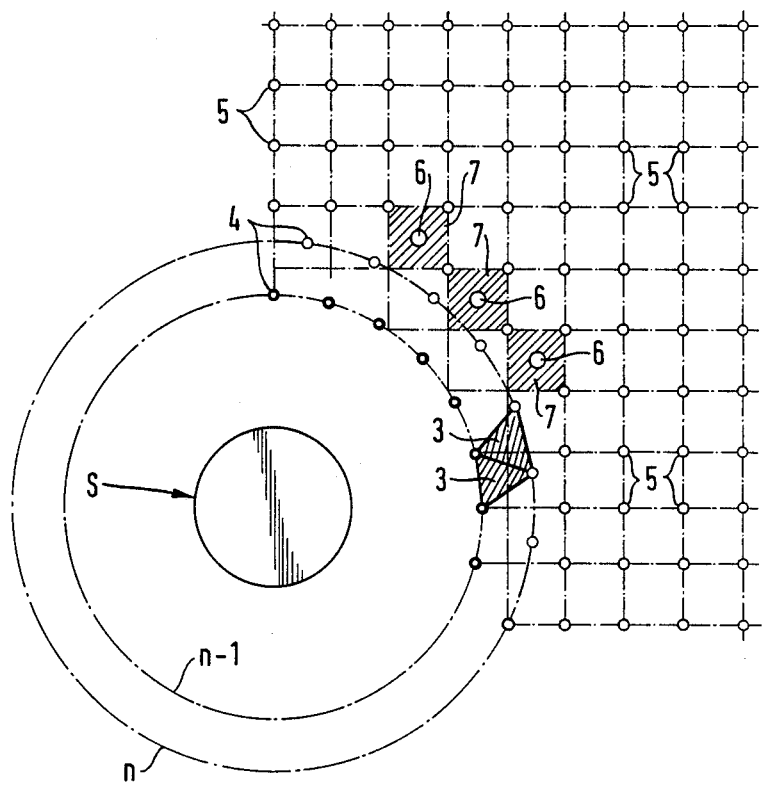

In the embodiment shown in FIG. 2, the circular pattern in the region adjacent the control electrode is followed by a square pattern in the remaining region. In order to assure the required density of the penetrations 5, the two patterns are superposed in the area of the interface in such a manner that the square pattern extends inwardly from the outer edge of the emitter beyond the outer circle n and the square surface sections 7 which contact or overlap the circle n, if they do not accommodate a penetration in the circular pattern, are provided with an additional penetration 6, not at their corners on the circle n or within the circle n, but in their centers. The areal extent of this additional penetration 6 may correspond to that of the regular penetrations.

A transition from a circular pattern to a rhombic pattern or a transition from a circular pattern to a hexagonal pattern can be realized in the same manner.

The advantages of the present invention are that by way of simple dimensioning rules, penetrations are provided in the vicinity of the control electrode as well as in the remaining region in a regular arrangement and with uniform density and the subdivided arrangement optimizes firing propagation and the dv/dt behavior over the entire emitter zone region.

I claim:

1. A thyristor comprising a semiconductor body having at least four sequential layers of alternatingly opposite conductivity types, one of said layers being an emitter zone and the contiguous layer of opposite conductivity type being a base zone; and a control electrode electrically connected to said base zone and surrounded by said emitter zone, wherein the improvement comprises a first penetration region in said emitter zone which includes a circular pattern defined by at least first and second groups of apertures arranged in the form of corresponding concentric circles of different diameters about said control electrode to permit electrical contact between said base and emitter zones, the number of apertures in each of said first and second groups being the same and the region of said emitter zone in which said first penetration region is located being of smaller expanse than the remainder of said emitter zone;

a second penetration region in said emitter zone, spaced from and surrounding said first penetration region, which includes a polygonal pattern defined by a plurality of apertures arranged in the form of regular polygons wherein said apertures are located at the vertices of said regular polygons to permit electrical contact between said base and emitter zones, and a transition region interposed between said first and second spaced penetration regions which includes a portion of a transition polygonal pattern defined by extending the polygonal pattern in said second penetration region toward said first penetration region to form extended regular polygons in said transition and first penetration region having the same configuration as the regular polygons in said second penetration region, wherein (1) no aperture is located at a vertice of said extended polygons which falls within or abuts said first penetration region unless said vertice coincides with an aperture of said first penetration region, and (2) each of said extended polygons is provided with an additional aperture therein if it does not contain an aperture of said first penetration region, whereby apertures are provided in said first and second penetration regions and in said transition region with a uniform density thereby optimizing firing propagation and the dv/dt behavior of said thyristor over the entire emitter zone.

2. A thyristor according to claim 1 wherein the apertures on adjacent concentric circles of said first penetration region are located so as to define a plurality of approximately equilateral triangles, adjacent apertures on adjacent concentric circles being displaced circumferentially from each other with respect to a radial line emanating from said control electrode.

3. A thyristor according to claim 1 wherein the ratio of the radius of the concentric circle of said first penetration region most remote from said control electrode to the radius of the concentric circle closest to said control electrode is not greater than 4.

4. A thyristor according to claim 1 wherein the plurality of apertures in said second penetration region of said emitter zone are arranged in a rectangular pattern.

5. A thyristor according to claim 1 wherein said additional apertures within said transition penetration region are located at the centers of said extended polygons.

6. A thyristor according to claim 1 wherein the spacing between adjacent concentric circles of said first penetration region is substantially the same.

7. A thyristor according to claim 6 wherein the apertures on adjacent concentric circles of said first penetration region are located so as to define a plurality of approximately equilateral triangles, adjacent apertures on adjacent concentric circles being displaced circumferentially from each other with respect to a radial line emanating from said control electrode.

8. A thyristor according to claim 6 wherein the ratio of the radius of the concentric circle of said first penetration region most remote from said control electrode to the radius of the concentric circle closest to said control electrode is not greater than 4.

9. A thyristor according to claim 6 wherein the plurality of apertures in said second penetration region of said emitter zone are arranged in a rectangular pattern.

10. A thyristor according to claim 6 wherein said additional apertures within said transition penetration region are located at the centers of said extended polygons.

* * * * *

UNITED STATES PATENT AND TRADEMARK OFFICE
CERTIFICATE OF CORRECTION

PATENT NO. : 4,760,438

DATED : July 26, 1988

INVENTOR(S) : Werner Tursky

It is certified that error appears in the above-identified patent and that said Letters Patent is hereby corrected as shown below:

ON THE TITLE PAGE, Item [63] should read

-- [63] Continuation of Ser. No. 258,530, Apr. 28, 1981, abandoned. --.

Signed and Sealed this

Third Day of January, 1989

Attest:

DONALD J. QUIGG

*Attesting Officer*　　　　　*Commissioner of Patents and Trademarks*